(12) United States Patent
Haevescher (10) Patent No.: US 8,508,215 B2
(45) Date of Patent: Aug. 13, 2013

(54) ARRANGEMENT FOR MEASURING AT LEAST ONE VALUE OF A VOLTAGE APPLIED TO AN ELECTRONIC COMPONENT

(75) Inventor: Rainer Haevescher, Stemwede (DE)

(73) Assignee: Lemforder Electronic GmbH, Espelkamp (DE)

( * ) Notice: Subject to any disclaimer, the term of this patent is extended or adjusted under 35 U.S.C. 154(b) by 416 days.

(21) Appl. No.: 13/060,876

(22) PCT Filed: Aug. 12, 2009

(86) PCT No.: PCT/DE2009/001121
§ 371 (c)(1), (2), (4) Date: Feb. 25, 2011

(87) PCT Pub. No.: WO2010/022700
PCT Pub. Date: Mar. 4, 2010

(65) Prior Publication Data
US 2011/0163734 A1 Jul. 7, 2011

(30) Foreign Application Priority Data
Aug. 29, 2008 (DE) .......................... 10 2008 044 908

(51) Int. Cl.
*G01R 1/00* (2006.01)
*G01R 19/00* (2006.01)
(52) U.S. Cl.
USPC .......................... 324/111; 324/76.11; 702/64
(58) Field of Classification Search
USPC .......... 324/76.11, 522, 713, 98, 111; 702/64, 702/57, 1
See application file for complete search history.

(56) References Cited

U.S. PATENT DOCUMENTS

| | | | |
|---|---|---|---|
| 4,649,341 A | 3/1987 | Ulbrich et al. | |
| 4,683,417 A | 7/1987 | De Burgat et al. | |
| 4,864,224 A * | 9/1989 | Roppelt et al. | ................ 324/119 |
| 4,968,946 A | 11/1990 | Maier | |

(Continued)

FOREIGN PATENT DOCUMENTS

| | | |
|---|---|---|
| DE | 101 18 299 A1 | 11/2002 |
| EP | 0 288 215 A2 | 10/1988 |
| EP | 0 438 103 A2 | 7/1991 |
| WO | 94/22026 A1 | 9/1994 |

OTHER PUBLICATIONS

Unbehauen, Rolf: Grundlagen der Elktrotechnik 2. 4. Auflage. Berlin: Springer, 1994. S. 6-7—ISBN 3-540-58161-8 See German Action.

*Primary Examiner* — Hoai-an D Nguyen
(74) *Attorney, Agent, or Firm* — Davis & Bujold, PLLC (57) ABSTRACT

An arrangement for measuring values of a voltage applied to an electronic component. The arrangement comprises a first signal transmitter which can emit a first switching signal, a first switch coupled to the first signal transmitter and can be controlled by the first switching signal. The electronic component is connected in series to the first switch and can be coupled, via the same, to an electric energy source. A second signal transmitter, which can emit a second switching signal. A second switch is coupled to the second signal transmitter and can be controlled by the second switching signal. A capacitive accumulator is connected in series to the second switch and can be connected in parallel, via the same, to the electronic component or to the series connection formed by the electronic component and the first switch. An analog/digital converter which is connected in parallel to the capacitive accumulator.

15 Claims, 3 Drawing Sheets

(56) References Cited

U.S. PATENT DOCUMENTS

| | | |
|---|---|---|
| 5,469,364 A | 11/1995 | Hughey et al. |
| 5,586,042 A | 12/1996 | Pisau et al. |
| 2008/0018306 A1* | 1/2008 | Shin et al. ..................... 320/149 |
| 2009/0201010 A1* | 8/2009 | Shin .............................. 324/98 |
| 2010/0097078 A1* | 4/2010 | Philipp et al. ................. 324/684 |

\* cited by examiner

ARRANGEMENT FOR MEASURING AT LEAST ONE VALUE OF A VOLTAGE APPLIED TO AN ELECTRONIC COMPONENT

This application is a national stage completion of PCT/DE2009/001121 filed Aug. 12, 2009 which claims priority from German Application Serial No. 10 2008 044 908.3 filed Aug. 29, 2008.

FIELD OF THE INVENTION

The invention relates to an arrangement for measuring at least one value of a voltage applied to an electronic component. Furthermore, the invention relates to a process for scanning at least one value of a signal flank occurring at an electronic component.

BACKGROUND OF THE INVENTION

There are diverse processes for measuring inductivity/capacity values. Particularly with regard to a micro-processor measuring system for low inductivity/capacity values and, where appropriate, a high number of analog construction elements, there are numerous disadvantages. On the one side, the high number of analog components results in a requirement for lots of space and in a high cost. On the other hand, such measuring systems are sensitive to environmental influences, e.g. variations of temperatures. In addition, implementation with a micro-processor is expensive.

A typical measuring principle for capturing inductivities and capacities is to measure the time up to reaching the threshold value for the charge or discharge curve in the course of current or voltage progress. In this context, the disadvantage is that the measurement of low inductivity/capacity values is difficult. In addition, it is disadvantageous that tolerances of the threshold value switch, strongly impacting the measuring result. And finally, it is disadvantageous that the measuring spectrum with a low time constant is limited due to the resolution of the time counter.

An additional process is the tuning of resonance frequencies in order to ascertain the inductivity or capacity. This process is also suitable for low inductivity/capacity values. In this context, it is disadvantageous that low-tolerance components are required, on the one side, and the duration of measurement is relatively long, due to the time needed for the frequency passage (frequency sweep), on the other.

Should the electronic component feature a relatively low capacity or inductivity, the occurring signal flanks can be very steep as in e.g. the case of a step response. In order to measure at least one value of such a fast electrical signal flank, a fast analog-digital converter is required, which is relatively expensive.

SUMMARY OF THE INVENTION

Based on the state of the art, the invention is based on the objective of being able to measure at least one value of a voltage applied to an electronic component even at relatively fast signal flanks, with the aid of a comparably inexpensive and simply-constructed arrangement.

The arrangement in accordance with the invention for measuring at least one value of a voltage applied to an electronic component, comprises a first signal transmitter, which can emit a first switching signal, a first switch coupled to the first signal transmitter and controllable by the first switching signal, wherein the electronic component is connected in series to the first switch and can be coupled, via the same, to an electric energy source, a second signal transmitter, which can emit a second switching signal, a second switch coupled to the second signal transmitter and controllable by the second switching signal, a capacitive accumulator, which is connected in series to the second switch, and can be connected in parallel, via the same, to the electronic component, or to the series connection formed by the electronic component and the first switch, and an analog/digital converter, which is connected in parallel to the capacitive accumulator.

When the first switch is closed at a first time, an electric voltage is applied to the electronic component with the aid of the electric energy source, or an electric current is supplied to the electronic component, which preferably leads to an initial compensation process, particularly to a step response, of the electronic component, which after a certain time changes over to a stationary or semi-stationary state. Should the first switch be opened at a later, second switching time, the electronic component is abruptly separated from the voltage and/or power supply, which preferably also leads to a compensation process, particularly to a step response, of the electronic component. Each of the compensation processes usually results in a change of the electric voltage applied to the electronic component, wherein the time path of the voltage applied to the electronic component in the course of the respective compensation process allows conclusions as to the electric properties of the electronic component.

A voltage applied to the electronic component is also applied to the capacitive accumulator in case of a closed, condition of the second switch. In this case, it is preferable to select the capacity of the capacitive accumulator so low, that during such a compensation process, it influences the voltage progress to the electronic component as little as possible, or not measurably so, within the parameters of the desired measurement precision. Should the second switch actually be opened at the measuring time, the voltage applied to the capacitive accumulator is maintained by the capacitive accumulator long enough, so that the analog/digital converter can capture this voltage and convert it to a digital signal.

Should the time difference between the first switching time and the measuring time and/or between the second switching time and the measuring time be known, it is possible to capture and digitize the voltage at the electronic component at a known time after the start of the compensation process with the aid of the analog/digital converter. It is preferable that this time difference be so small, that the second switch is opened before the compensation process at the electronic component initiated by switching the first switch has receded in regard to the measuring precision.

Since short time differences between two switching signals at high precision can be produced with relatively simple means, the arrangement in accordance with the invention can be realized at a comparably low expense and with simple construction. Thus, the analog/digital converter does not have to follow the compensation process in regard to its speed and can work relatively slowly as compared to it. However, it is preferable that the properties of the capacitive accumulator match the speed of the analog/digital converter, so that the capacitive accumulator can maintain the voltage applied to it within the precision measuring parameters, until the analog/digital converter has carried out the capture and digitization of this voltage.

The electrical energy source, with the aid of which an electrical voltage is applied to the electronic component, or electrical current that is supplied to the electronic component, or can be applied/supplied to them, preferably comprises an electrical voltage source or electrical power source, or preferably features an electrical voltage source or electrical power source. Should the first switch be closed, it causes a voltage to be applied to the electronic component and/or a current be supplied to the electronic component. The electrical energy source can be directly connected in parallel to the in-series connection comprising the electronic component and the first switch. As an alternative, the electrical energy source can be connected in parallel to this in-series connection with the aid of an in-line arrangement of at least one additional electronic component. At least one additional electronic component comprises e.g. one or several Ohm-resistors and features same. The electronic component is particularly coupled to the electrical energy source with an in-line arrangement of at least one Ohm-resistor.

Preferably, the analog/digital converter is connected in parallel directly to the capacitive accumulator. As an alternative, the analog/digital converter is connected in parallel to the capacitive accumulator with an in-line arrangement of at least one electronic component. This at least one additional electronic component comprises e.g. an Ohm-resistor.

The capacitive accumulator preferably features at least one condenser, or comprises at least one condenser. In particular, the capacitive accumulator can encompass at least one other electronic component.

The first switch preferably features a transistor or comprises a transistor, wherein the transistor particularly is a field-effect transistor.

The first signal transmitter preferably features a pulse-width modulator unit, or comprises a pulse-width modulator unit. A pulse-width modulator unit enables production of a signal in a simple manner, particularly a square-wave signal, whose impulse duration and/or sensory relationship can be adjusted with high precision. Furthermore, the second signal transmitter preferably features a pulse-width modulator unit, or comprises a pulse-width modulator unit, so that a signal, particularly a square-wave signal, whose impulse duration and/or sensory relationship can be adjusted with high precision, can be produced in a simple manner.

The first switching signal is preferably a square-wave signal, or preferably at least comprises a square-wave signal. Furthermore, the second switching signal is preferably a square-wave signal, or preferably at least comprises a square-wave signal. In particular, the square-wave signal of the second switching signal features a different impulse duration and/or a different sensory relationship than the square-wave signal of the first switching signal. Preferably, the square-wave signal of the second switching signal features a shorter impulse duration and/or a smaller sensory relationship than the square-wave signal of the first switching signal.

The second switch can also comprise a transistor, particularly a field-effect transistor. It is preferable that the second switch comprises a multiplexer, or is coupled to a multiplexer. In particular, the capacitive accumulator, with the aid of the multiplexer, can be connected in parallel to at least one other electronic component, which is in particular connected in series to the first switch, or to an in-series connection consisting of other electronic component and the first switch. Preferably, the other electronic component is coupled, or can be coupled directly, or via an in-line arrangement of at least one electronic component, as e.g. of an Ohm-resistor, to the electrical energy source. It is possible to measure voltages in different electronic components with the aid of the multiplexer. The different electronic components are in this case preferably connected to different signal inputs of the multiplexer, which thus constitute different measuring channels. The second signal transmitter is particularly connected to an enabling input of the multiplexer.

Both signal transmitters and/or the analog/digital converter are preferably integrated into a control unit, which particularly comprises or encompasses a micro-processor, a micro-controller, a programmable integrated switching circuit, as e.g. a FPGA, or an application-specific integrated coupling, as e.g. an ASIC—so that the arrangement in accordance with the invention can be set up in a highly space-saving manner. Since the control units with integrated analog/digital converters and/or integrated signal transmitters, as e.g. pulse-width modulator units are available on the market as mass products, the arrangement in accordance with the invention can be realized at extremely low expense. As it was already mentioned above, it is not disadvantageous if the analog/digital converter works relatively slowly.

If the two signal transmitters feature a pulse-width modulator unit each, or if both signal transmitters comprise a pulse-width modulator unit each, it is possible to set impulse durations and/or sensory relationships of both switching signals in a simple manner. This enables adjustment of the time difference between the first switching time and the measuring time and/or between the second switching time and the measuring time, with great precision, particularly when both signal transmitters are aligned to each other in time, which is preferably also the case. This adjustment of time can e.g. be carried out with the aid of a joint pulse transmitter.

Both signal transmitters are preferably controlled, or can be controlled with the aid of a joint control device, which is particularly paced with the aid of a pulse transmitter, which preferably produces a periodic pulse signal. Thus, the impulse duration and/or the sensory relationship of each switching signal can be set with the precision of a pulse cycle or a whole-digit multiplier of the pulse cycle. The impulse duration of each switching signal thus amounts to one or several pulse cycles. Furthermore, the impulse durations and/or impulse ends of the two switching signals differ; particularly by one pulse cycle or by a whole-digit multiplier of a pulse cycle. Preferably the time difference (time window) between the first switching time and the measuring time and/or between the second switching time and the measuring time, corresponds to one or to a whole-digit multiplier of a pulse cycle. The control device particularly comprises the above-mentioned control unit, so that both signal transmitters and/or the analog/digital converter are integrated into the pulsed control device.

Particularly both signal transmitters simultaneously transmit a switching signal at the first switching time, which signal is a square-wave signal, so that both switches are closed simultaneously. Closing the first switch, as described above, initiates the compensation procedure, wherein the capacitive accumulator is separated from the electronic component at measuring time. The difference between the first switching time and the following measuring time can correspond to one pulse cycle or several pulse cycles. A typical pulse cycle or processor cycle amounts e.g. to 50 ns. Since this means that the voltage applied to the electronic component can be captured and digitized at a defined time after the start of the compensation procedure, with the aid of the analog/digital converter, a statement about the properties of the electronic component is possible. In order to determine those properties more precisely, the measurement can be repeated at different time intervals between the first switching time and the measuring time. Thus one can successively scan the repeatedly occurring flank, wherein the time resolution of scanning especially corresponds to the pulse cycle, or to a whole-digit multiplier thereof.

As an alternative, the first switching signal holds the first switch closed for as long as a possible compensation procedure has receded and a stationary or semi-stationary state is attained. When the first switch is opened at the second switching time, particularly at the end of the first square-wave signal, the compensation procedure will start (again). At the time of measuring time being after the second switching time, the capacitive accumulator is separated from the electronic component with the aid of the second switch, so that the voltage applied to the capacitive accumulator at the measuring time, which corresponds to the voltage applied to the electronic component at that time, can be captured and digitized with the aid of the analog/digital converter. Preferably, the measuring time lies one or several pulse cycles behind the second switching time. Since this means that the voltage applied to the electronic component can be captured and digitized at a defined time after the (repeated) start of the compensation procedure, with the aid of the analog/digital converter, a statement about the properties of the electronic component is possible. In order to determine those properties more precisely, the measurement can be repeated at different time intervals between the second switching time and the measuring time. Thus, one can successively scan the repeatedly occurring flank, wherein the time resolution of scanning especially corresponds to the processor cycle, or to a whole-digit multiplier thereof. In this case, it is also preferable that both signal transmitters simultaneously transmit a switching signal, which is especially a square-wave signal, at the switching time, which then causes both switches to be closed simultaneously.

As described above, the control unit preferably produces a time window of 1 to n pulse cycles (n is a natural number), wherein the smallest time window encompasses one pulse cycle. It is not necessary that both signal transmitters emit a switching signal at the first switching time simultaneously. For example, the second signal transmitter can also emit the second switching signal at a time before, or after the first switching time. A pulse cycle in a micro-processor or micro-controller is typically a processor cycle. Furthermore, the time window is preferably produced with the aid of the pulse-width modulation. But it is also possible to produce the time window with a software algorithm. This is possible e.g. in case of a micro-controller with a process without the pulse-width modulation with approximately 4 to n pulse cycles, or with an FPGA without pulse-width modulation, by describing the solution in a hardware description language, e.g. in VHDL.

The electronic component comprises at least one electronic structural element, but can also be designed as an electronic module. Preferably, the electronic component comprises of at least one condenser, or at least one inductor, as e.g. an electrical coil.

An evaluation device, especially a digital evaluation device, is preferably switched downstream of the analog/digital converter, in order to e.g. determine one property of the electronic components, as e.g. their inductivity or capacity, from at least one measured value or measured values. In this context, the evaluation device can comprise the control unit, the control device, the micro-processor and/or micro-controller.

Furthermore, the invention relates to the use of the arrangement in accordance with the invention to determine a property, preferably an electrical property, particularly the inductivity or the capacity, of at least one electronic component.

In addition, the invention relates to a process for scanning at least one value of a signal flank occurring in an electronic component, wherein a) a voltage is applied to the electronic component and/or a current is supplied to the electronic component, at a first switching time, b) a capacitive accumulator is connected in parallel to the electronic component, c) the capacitive accumulator is separated from the electronic component at a measuring time, wherein the measuring time remains set back by a time difference behind the first switching time, d) the voltage applied to the capacitive accumulator is captured and digitized at the measuring time.

In this sense, the process step b) is particularly carried out at the first measuring time. Furthermore, the process steps a) through d) are preferably repeated at least once at a varying time difference. Also, the electronic component can be replaced at least once with another electronic component, upon which and wherein the process steps a) through d) are repeated after each replacement.

To carry out the process, the arrangement in accordance with the invention is particularly used, so that the electronic components used for the process can correspond to the electronic components of the arrangement and can be developed further as described. Particularly, a periodic pulse signal can be produced, wherein the difference between the first switching time and the measuring time preferably corresponds to one or a whole-digit multiplier of the pulse cycle of the pulse signal.

The objective of the invention particularly lies in the scanning of fast electrical signal flanks and the evaluation of the progress, e.g. to measure the inductivity or capacity. In this sense, the low technical and monetary expense is of advantage, with the aim of capturing a high number of measuring channels, in which only small capacity or inductivity of e.g. 1 µH exists.

During the control of an electronic component in its capacitive or inductive function, a time-delayed voltage curve occurring after the application of a square-wave signal depends on the inductivity and/or capacity and/or the Ohm-resistance of the electronic component. In case of low inductivity or a low capacity, these time-processes are so fast, that a scan of the signal curve with simple, cost-effective analog/digital converters is not possible, as the attained scan-rate does not suffice.

Preferably, the solution in accordance with the invention is based on the fact, that a micro-processor itself sends a square-wave signal to the measured object (electronic component), with a pulse-width modulator unit. A second pulse-width modulator unit is started synchronously. The square-wave impulse of the first pulse-width modulator unit energizes the measured object or several measured objects. The second pulse-width modulator unit interrupts the signal guided back from the measured object to the analog/digital converter of the micro-controller with an offset of 1 to n processor cycles (n stands for a natural number) and thus saves the analog voltage value in a condenser (sample and hold principle). Thus, the processor cycle determines the resolution of the pulse-width modulator unit. A slow analog/digital converter (external or integrated into the micro-processor) is thus able to scan the saved signal. Through the repeating signal of the first pulse-width modulator unit and the jitter (fluctuation) of 1 to n processor cycles of the impulse duration of the second pulse-width modulator signal, in relation to the impulse duration of the first pulse-width modulator signal, it is possible to discretize and evaluate in several cycles, the fast impulse response of the measured object with 1 to n scans.

At this time, the second pulse-width modulator unit preferably emits the direct enabling signal of the signal multiplexer. Thus, the multiplexer serves to switch between measuring channels as well as to control the sample-and-hold function.

The preferred characteristic of the invention is the time response, i.e. that switching signal can be controlled cycle-precise in a time window of 1 to n pulse cycles, wherein the cycle particularly corresponds to the fastest time of carrying out orders, or the pulse speed of the control device. Preferably, the control device synchronizes the entire time response with the conversion time of the analog/digital converter. It is thus possible to use an analog/digital converter integrated into the micro-controller or an external one, which works relatively slowly in comparison to the relevant time processes.

In particular, the invention offers the following advantages:

High scan-rates in a micro-processor are possible. Particularly a one up to a hundred-fold higher analog scan-rate is possible than the one specified for a typical micro-processor with an analog/digital converter.

A simple signal conditioning for a high number of sensor channels is possible.

No analog processing is required; a purely digital system up to the analog/digital converter is possible; simple multiplexers can be used.

It is possible to reduce the number of components.

Only a small construction space is required.

It is possible to reduce costs.

The arrangement and/or the process is/are temperature-stable for the most part, due to a low number of semi-conductors and low number of analog switching parts, among others.

BRIEF DESCRIPTION OF THE DRAWINGS

The invention is described in the following based on a preferred embodiment with reference to the drawings. The drawings depict.

DETAILED DESCRIPTION OF THE DRAWINGS

Figure 1:
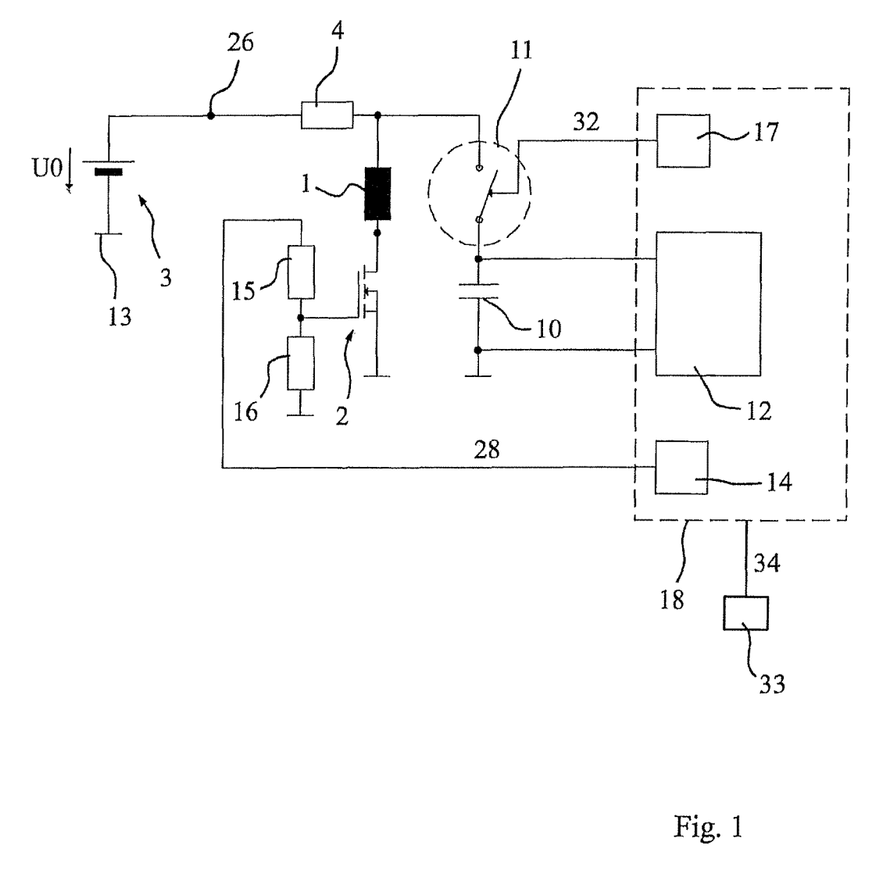
FIG. 1 a schematic block diagram of an arrangement according to an embodiment of the invention, FIG. 2 a partial block diagram of the arrangement with several measured objects, and FIG. 3A-3C schematic depictions of signal paths per the embodiment form.

FIG. 1 depicts a schematic block diagram of an arrangement per an embodiment of the invention, wherein the electronic component (measured object) 1 designed as an inductor, is connected in series to the first switch 2 comprising a field-effect transistor and thus creates a first in-series switch. A voltage source 3 is connected to the measured object 1 via the interconnection of an Ohm-resistor 4, with which source an electrical voltage is applied to the first in-series switch. The voltage source is connected to the resistor 4 with one of its connectors, and to ground 13 with its other connector. In addition, the source connector of the field-effect transistor 2 is connected to ground 13. The first in-series connection is connected in parallel to a second in-series connection, which features a capacitive accumulator 10 comprising a condenser and an additional second switch 11 connected to it in-series. Thereby, the connector of the capacitive accumulator 10 not connected to the switch 11, is connected to ground 13. Furthermore, an analog/digital converter 12 is connected in parallel to the capacitive accumulator 10.

A first pulse-width modulator unit 14 is connected to the gate connector of the field-effect transistor 2, via a voltage divider comprising two resistors 15 and 16, the transistor thus serves as a switch, which is opened and/or closed, or can be opened and/or closed, via a switching signal 28 (refer to FIG. 3C), emitted by the pulse-width modulator unit 14. Thus, depending on the first switching signal 28, the electronic component 1 can be connected to ground 13 or be separated from it. Even though the switch 2 in this case comprises a field-effect transistor, the switch 2 can still comprise another suitable component, which enables the realization of an electrical switch. Furthermore, the switch 11 can be closed and/or opened with the aid of a second switching signal 32 (refer to FIG. 3B) emitted by a pulse-width modulator unit 17. Both pulse-width modulator units 14 and 17 as well as the analog/digital converter 12 are in this sense integrated into a micro-processor or micro-controller 18. A pulse signal 34 is produced with the aid of a pulse generator 33 and is supplied to the micro-processor or micro-controller 18. The micro-processor or micro-controller comprises a control device, which can also comprise an FPGA or ASIC.

Figure 2:
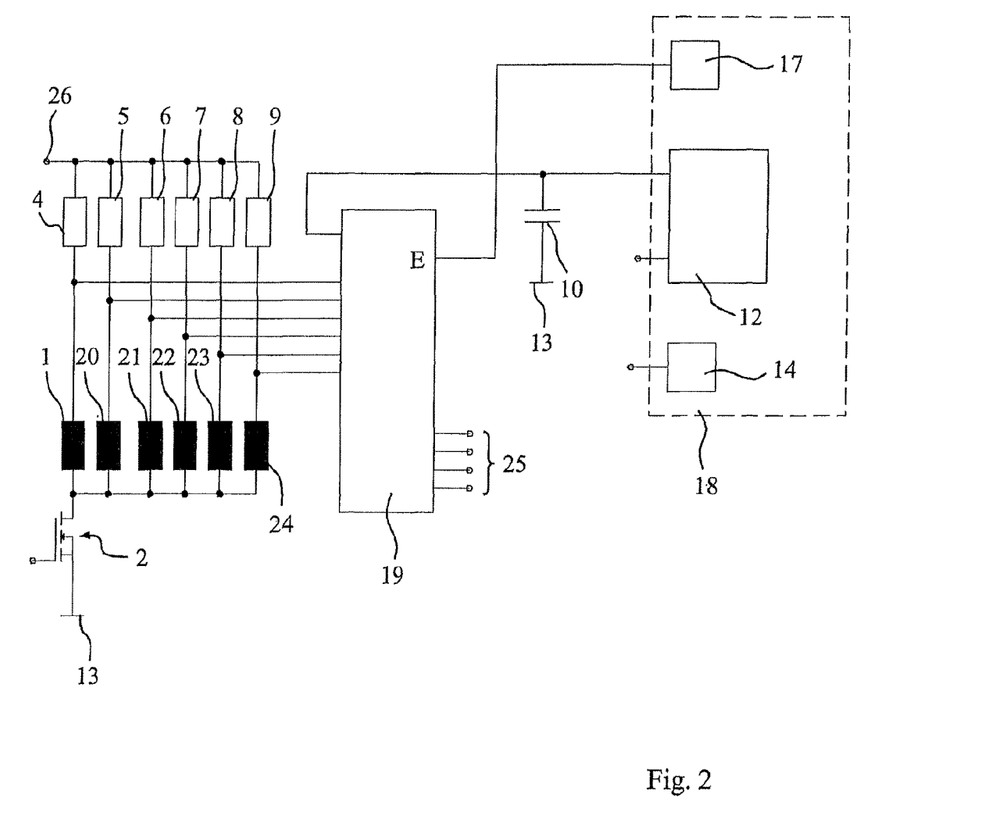

The switch 11 comprises a multiplexer 19, which is depicted in FIG. 2. Thereby, the pulse-width modulator unit 17 is connected to the release input E of the multiplexer 19, so that the condenser 10 is connected, or can be connected in parallel to the electronic component 1, via the activation of the release input E (which corresponds to actuating switch 11). Deactivation of release input E with the aid of the pulse-width modulator unit 17, respectively with the aid of the second switching signal 32 emitted by it, causes the condenser 10 to be separated from the electronic component 1.

FIG. 2 depicts five additional electronic components (measuring objects) 20 through 24, designed as inductors, which are connected to the multiplexer 19 on the one end and with the outlet of the electronic component 1 connected to the field-effect transistor 2 on the other. As the electronic components 1 and 20 through 24 are connected to different connectors of the multiplexer 19, the condenser 10 can be connected with each of these electronic components with the aid of the multiplexer 19. Thereby, at a particular point in time, the condenser 10, by means of the multiplexer 19, is either connected to one or none of the electronic components. In order to select, which of the electronic components is connected to the condenser 10 with the aid of the multiplexer 19, the multiplexer 19 features several inputs 25, to which the selected signals suitable to the respective connection are applied, or can be applied. Thus, it becomes possible to measure the voltages at different electronic components 1 and 20 through 24 one after another.

Just as the electronic component 1, which as depicted in FIG. 1, is connected to the node 26 via the resistor 4, so are also the other electronic components 20 through 24, facing away from the switch 2, via an Ohm-resistor 5 through 9, respectively, electrically connected to the node 26 with their connectors.

Figure 3A:
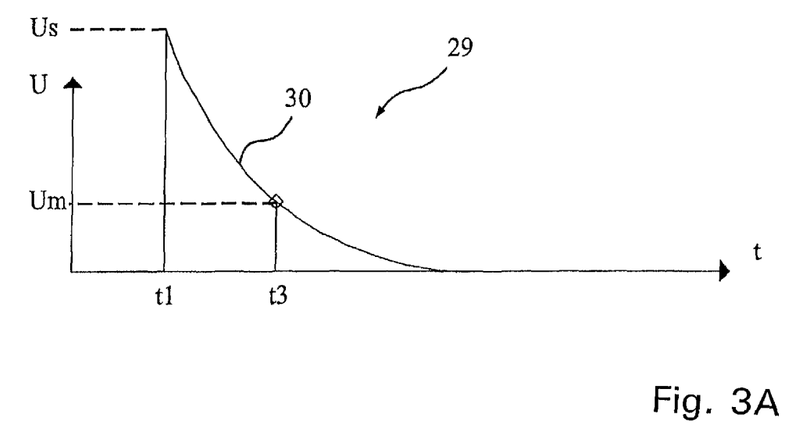
Figure 3B:
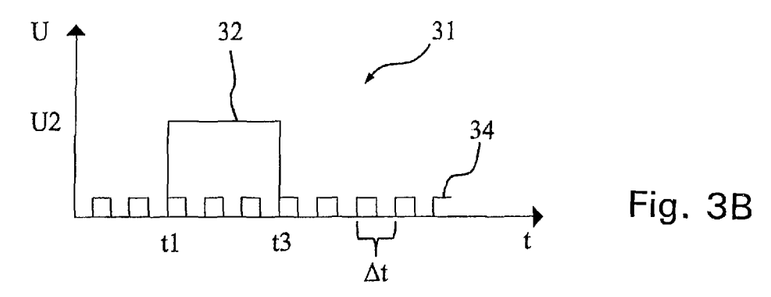
Figure 3C:
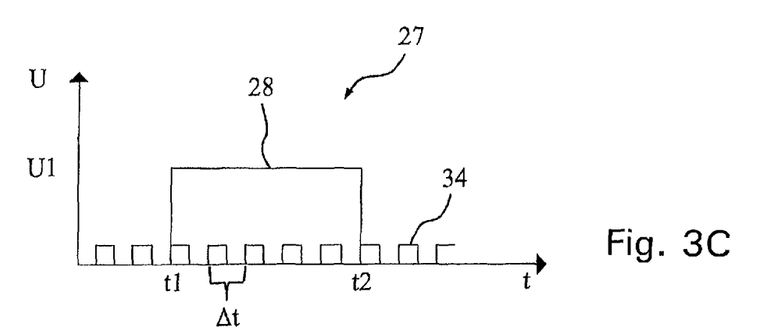

FIGS. 3A, 3B, 3C depict several signal paths, which help explain the functionality of the measuring arrangement. Graph 27 depicts the first switching signal 28, which is emitted by the pulse-width modulator unit 14, which signal suddenly rises to a voltage U1 at a first switching time t1. This causes the field-effect transistor 2 to be conductively switched on, respectively, the transistor 2 comprising the switch is closed, so that a voltage is applied to the inductor 1. At a later second switching time t2, the first switching signal 28 is switched off, which has the effect of locking the field-effect transistor 2. Since the current running through a coil is steady, a voltage 30, depicted on graph 29, is inducted in the inductor 1 at time t1. Starting at the peak voltage Us, the voltage 30 recedes with progressing time t. Graph 31 depicts the time progression of the second switching signal 32 emitted by the pulse-width modulator unit 17, which signal also suddenly rises to a voltage value U2 at the first switching time t1. This causes the switch 11 to close, so that the voltage applied to inductor 1 is also applied to the condenser 10. At a later measuring time t3, the second switching signal 32 is switched off: and this causes the switch 11 to open, so that the condenser 10 is separated from the inductor 1. The voltage Um applied to the inductor 1 at the measuring time t3 is maintained by the condenser 10 until the analog/digital converter 12 can capture and digitize the voltage Um. The digitized voltage Um is then furnished to the micro-processor 18 for further processing. In accordance with the depicted embodiment: t1<t3<t2. Thus, the time difference between the measuring time t3 and the first switching time t1 corresponds to a whole-digit multiplier of the clock cycle $\Delta t$ of the clock signal 34, as follows: $t3-t1=n*\Delta t$, n is a natural number.

In an exemplary embodiment the time difference between t2 and t1 amounts to approx. 2 to 3 μs. The inductance amounts to approx. 10 μH. Furthermore, the processor cycle $\Delta t$ has a duration of approximately 50 ns, so that the time difference between the first switching time t1 and the measuring time t3 is set, or can be set to a whole-digit multiplier of 50 ns. Repeating the measurement at variable time differences between the measuring time t3 and the first switching time t1, enables scanning the reoccurring voltage 30 at time steps, which correspond to the processor cycle $\Delta t$, or a whole-digit multiplier thereof. As is depicted in FIGS. 3B and 3C, the paths of both switching signals 28 and 32 each feature a square-wave signal.

List of Reference Characters
1 Inductor
2 Switch/field-effect transistor
3 Voltage source
4 Resistor
5 Resistor
6 Resistor
7 Resistor
8 Resistor
9 Resistor
10 Condenser
11 Switch
12 Analog/digital converter
13 Ground
14 Pulse-width modulator unit
15 Resistor
16 Resistor
17 Pulse-width modulator unit
18 Micro-processor
19 Multiplexer
20 Inductor
21 Inductor
22 Inductor
23 Inductor
24 Inductor
25 Inputs
26 Node
27 Graph
28 First switching signal
29 Graph
30 Voltage at Inductor
31 Graph
32 Second switching signal
33 Pulse transmitter
34 Pulse signal
U Voltage
U0 Voltage of the voltage source
U1 Switching voltage of the first switching signal
U2 Switching voltage of the second switching signal
Us Peak voltage at Inductor
Um Measured voltage
E Enabling input of the multiplexer
t Time
t1 First switching time
t2 Second switching time
t3 Measuring time
$\Delta t$ Pulse cycle of pulse signal

The invention claimed is:

1. An arrangement for measuring at least one value of a voltage applied to an electronic component, the arrangement comprising:
   a first signal transmitter (14) for emitting a first switching signal (28), the first signal transmitter (14) being coupled to a first switch (2), which is controllable by the first switching signal (28),
   the electronic component (1) being connected in series to the first switch (2) which is connectable, via the electronic component (1), to an electric energy source ($^3$);
   a second signal transmitter (17) for emitting a second switching signal (32);
   a second switch (11) being coupled to the second signal transmitter (17), and being controllable by the second switching signal (32);
   a capacitive accumulator (10) being connected in series with the second switch (11) and being connectable in parallel, via the second switch (11), to either the electronic component (1) or to the series connection formed by the electronic component (1) and the first switch (2); and
   an analog/digital converter (12) being connected in parallel to the capacitive accumulator (10).

2. The arrangement according to claim 1, wherein the electronic component (1) is couplable to the electrical energy source (3) via an inline arrangement of at least a one Ohm-resistor (4).

3. The arrangement according to claim 1, wherein the capacitive accumulator comprises a condenser (10).

4. The arrangement according to claim 1, wherein the first switch comprises a transistor (2).

5. The arrangement according to claim 1, wherein the first signal transmitter comprises a pulse-width modulator unit (14) and the first switching signal (28) is a right-angle signal.

6. The arrangement according to claim 5, wherein the second signal transmitter comprises a pulse-width modulator unit (17) and the second switching signal (32) comprises a right-angle signal which has an impulse duration that is shorter than an impulse duration of the right-angle signal of the first switching signal (28).

7. The arrangement according to claim 1, wherein the second switch comprises a multiplexer (19), the capacitive accumulator (10) is connectable in parallel, via the multiplexer (19), to at least one other electronic component (20) that is connected in series with the first switch (2) or to an in-series connection comprising another electronic component (20) and the, first switch (2).

8. The arrangement according to claim 1, wherein both of the first and the second signal transmitters (14, 17) and the analog/digital converter (12) are integrated into one of a micro-processor and a micro-controller (18).

9. The arrangement according to claim 1, wherein both of the first and the second signal transmitters (14, 17) and the analog/digital converter (12) are integrated in a pulsed control device (18) and impulse ends of the first and the second switching signals (28, 32) differ either by one of one pulse cycle and a whole multiplier of a pulse cycle of the pulsed control device (18).

10. The arrangement according to claim 1, wherein the at least one value of the voltage applied to the electronic component determined by the arrangement is one of an inductance of the electronic component (1) and a capacitance of the electronic component (1).

11. A method for measuring at least one value of a signal flank occurring at an electronic component with an arrangement comprising a first signal transmitter (14) for emitting a first switching signal (28), the first signal transmitter (14) being coupled to a first switch (2) that is controllable by the first switching signal (28), the electronic component (1) being connected in series to the first switch (2) which is connectable, via the electronic component (1), to an electric energy source (3), a second signal transmitter (17) for emitting a second switching signal (32), a second switch (11) being coupled to the second signal transmitter (17), and being controllable by the second switching signal (32), a capacitive accumulator (10) being connected in series with the second switch (11) and being connectable in parallel, via the second switch (11), to one of the electronic component (1) and to the series connection formed by the electronic component (1) and the first switch (2), and an analog/digital converter (12) being connected in parallel to the capacitive accumulator (10), the method comprising the steps of:
 a) at least one of applying a voltage and supplying a current to the electronic component (1) at a first switching time (t1);
 b) connecting the capacitive accumulator (10) in parallel to the electronic component (1);
 c) separating the capacitive accumulator (10) from the electronic component (1) at a second measuring time (t3), and the second measuring time (t3) being set back by a time difference behind a first measuring time (t2); and
 d) recording and digitizing the voltage applied to the capacitive accumulator (10) at the second measuring time (t3).

12. The method according to claim 11, further comprising the step of connecting the capacitive accumulator (10) in parallel to the electronic component (1) at the first switching time (t1).

13. The method according to claim 11, further comprising the step of repeating steps (a), (b), (c) and (d) at varying time differences.

14. The method according to claim 11, further comprising the step of producing a periodic pulse signal (34) at varying time differences which correspond to one or a whole-digit multiplier of a pulse cycle ($\Delta t$) of the pulse signal (34).

15. An arrangement for measuring at least one value of a voltage applied to an electronic component, the arrangement comprising:
 a first signal transmitter (14) being connected to a first switch (2) which is connected in series to the electronic component (1) that is connected to an electric energy source (3),
 the first signal transmitter (14) transmitting a first switching signal (28) to the first switch (2), the first switch (2) either opening or closing depending on the first switching signal (28) transmitted by the first signal transmitter (14) to either facilitate or disrupt communication between the electronic component (1) and a ground (13);
 a second signal transmitter (17) being connected to a second switch (11), the second switch (11) being controlled by a second switching signal (32) that is transmitted by the second signal transmitter (17);
 a capacitive accumulator (10) being connected in series to the second switch (11), and connectable in parallel, via the second switch (11), to either the electronic component (1), or the series connection formed by the electronic component (1) and the first switch (2); and
 an analog/digital converter (12) being connected in parallel to the capacitive accumulator (10).

\* \* \* \* \*